United States Patent
Basheer et al.

(10) Patent No.: US 7,498,197 B2
(45) Date of Patent: Mar. 3, 2009

(54) SILICA NANOPARTICLES THERMOSET RESIN COMPOSITIONS

(75) Inventors: Rafil A. Basheer, Rochester Hills, MI (US); Derek B. Workman, Noblesville, IN (US); Mohamed Bouguettaya, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/531,434

(22) Filed: Sep. 13, 2006

(65) Prior Publication Data

US 2008/0122118 A1 May 29, 2008

(51) Int. Cl.
*H01L 21/44* (2006.01)

(52) U.S. Cl. .................. 438/108; 438/124; 438/126; 257/E23.121

(58) Field of Classification Search ............. 438/108, 438/124, 126; 257/E23.121, E21.503
See application file for complete search history.

(56) References Cited

U.S. PATENT DOCUMENTS

| | | | | |
|---|---|---|---|---|
| 5,821,456 | A | * 10/1998 | Wille et al. | 174/565 |
| 6,660,560 | B2 | 12/2003 | Chaudhuri et al. | 438/108 |
| 6,899,948 | B2 | 5/2005 | Zhang et al. | 428/331 |
| 6,943,058 | B2 | 9/2005 | Chaudhuri et al. | 438/108 |
| 2002/0117259 | A1* | 8/2002 | Giroux et al. | 156/330 |
| 2003/0069331 | A1* | 4/2003 | Teiichi et al. | 523/176 |
| 2004/0102529 | A1 | 5/2004 | Campbell et al. | 916/79 |
| 2006/0103029 | A1 | 5/2006 | Basheer et al. | 257/778 |
| 2006/0199301 | A1* | 9/2006 | Basheer et al. | 438/106 |

* cited by examiner

*Primary Examiner*—Hsien-ming Lee
(74) *Attorney, Agent, or Firm*—Jimmy L. Funke

(57) ABSTRACT

A themosettable material having excellent processability, and which cures to form a thermoset composition having a low coefficient of thermal expansion and a high glass transition temperature includes functionalized nanoscopic silica particles dispersed in a curable resin comprising a polyepoxide having at least three epoxide groups per molecule. The composition is useful as an underfill for flip-chip circuit assemblies.

30 Claims, 2 Drawing Sheets

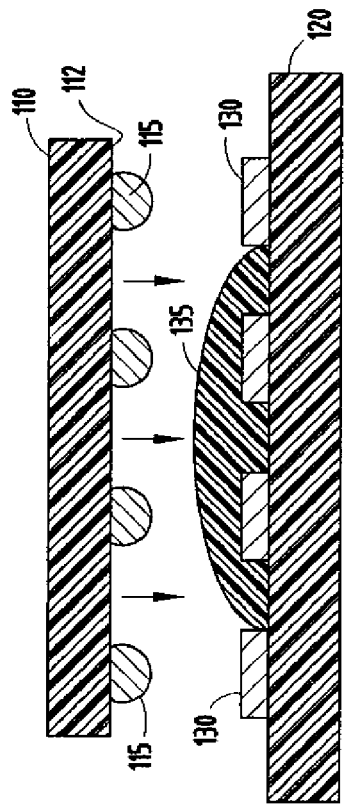
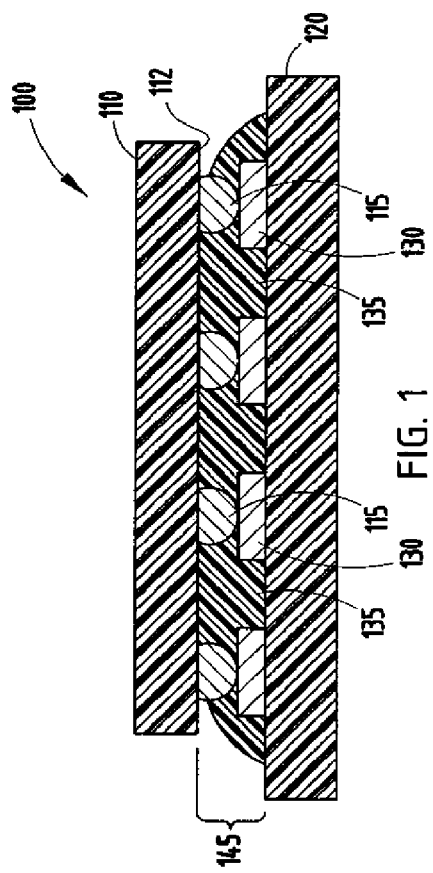

SILICA NANOPARTICLES THERMOSET RESIN COMPOSITIONS

TECHNICAL FIELD

This invention relates to processable, curable compositions that upon curing form a thermoset resin exhibiting a low coefficient of thermal expansion, and electrical components underfilled with said thermoset resin.

BACKGROUND OF THE INVENTION

Integrated circuit assemblies are employed in a wide variety of electronic applications. Increasing demand for high performance yet reliable electronic products that are ever smaller, lighter, and cost effective has lead to corresponding demands on the manufacturers of integrated circuit assemblies.

Such circuit assemblies have traditionally employed a circuit board and at least one electrical component (e.g., an integrated circuit device) connected to the circuit board by a plurality of connectors, wires and/or solder bumps. It has been known that differences between the coefficients of thermal expansion (CTE) of the circuit board and electric component can contribute to early fatigue failure of solder interconnections, especially during thermal cycling of the circuit assembly. Differences in CTE are especially problematic for integrated circuit assemblies used in environments subjected to high temperatures, such as applications in close proximity to internal combustion engines, i.e., on-board motor vehicle applications.

Epoxy resins have been used in the manufacture or integrated circuit assemblies. In some cases, such resins are disposed between the electric component and circuit board to anchor or adhere the electronic component to the circuit board, to encapsulate and protect the connectors, and/or to mitigate the differences between the CTE's of the components of the circuit assembly.

For example, epoxy resins have been utilized as underfill materials in the manufacture of integrated circuit assemblies having a flip chip construction. Underfill materials are intended to support and protect the electrical connections of the flip chip while simultaneously reducing the thermal-mechanical stress on the flip chip connections.

Known epoxy resins have generally been unable to provide cured underfill materials having a desirably low CTE. Epoxy resins having a CTE of less than 60 ppm/° C. are especially advantageous in mitigating the differences between the CTEs of the die and circuit board. Suitable epoxy resin compositions have often been achieved only with the use of significant amounts of CTE-reducing fillers.

Unfortunately, the use of such fillers has traditionally resulted in increased manufacturing challenges and problems.

For example, circuit assembly manufacturing processes using capillary-flow underfill technology typically require introduction of an epoxy resin based underfill composition into the interstitial spaces of an integrated circuit assembly. The presence of CTE-reducing fillers in such compositions can result in an increased viscosity that impedes the flow and distribution of the underfill composition, and/or causes damage to delicate electronic components. Such processes are often characterized as unacceptably long and/or costly.

In no-flow underfill processes, the epoxy based underfill material is typically applied to the surface of an integrated circuit substrate, To join a flip chip to the substrate, the bumps of the flip chip are pushed through the underfill material until the flip-chip bumps make contact with corresponding substrate bond pads. In this case, filler particles can become undesirably trapped between the flip-chip bumps and the corresponding substrate bond pads.

Thus, epoxy resin based compositions having low amounts of CTE-reducing fillers are advantageous as compared to those having greater amounts of CTE-reducing filler.

In addition, epoxy resins useful in the construction of integrated circuit assemblies must also have a reaction profile that accommodates the reflow profile of the solder used therein. In particular, it would be highly desirable if the solder reflowed before substantial cross-linking of the epoxy resin occurs. However, cross-linking must progress quickly once solder reflow has occurred.

Thus, known epoxy resins have not fully resolved challenges associated with the design and manufacture of integrated circuit asseremblies, especially flip chips.

SUMMARY OF THE INVENTION

In one aspect of the invention, there is provided an electric circuit assembly having an underfill material disposed between a substrate and an electronic component, wherein the underfill material is a curable composition comprising a thermosettable resin and functionalized nanoscopic silica particles distributed in the thermosettable resin. The thermosettable resin comprises a polyepoxide having at least three epoxide groups per molecule.

In accordance with another aspect of the invention, there is provided a circuit assembly comprising a substrate, an electronic device having electrical connectors mechanically and electrically connecting the electronic device to the substrate in spaced relation to the substrate, and a cured composition disposed in the space between the substrate and the electronic device, the cured composition comprising functionalized nanoscopic silica particles distributed in a thermoset resin comprising a polyepoxide having at least three epoxide groups per molecule.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a cross-sectional view of one embodiment of the disclosed integrated circuit assembly.

FIG. 2 is a cross-sectional view of an integrated circuit assembly made according to one disclosed method of making an integrated circuit assembly.

FIG. 3 is a cross-sectional view of an integrated circuit assembly made according to a second disclosed method of making an integrated circuit assembly.

DESCRIPTION OF THE PREFERRED EMBODIMENTS

Figure 4:
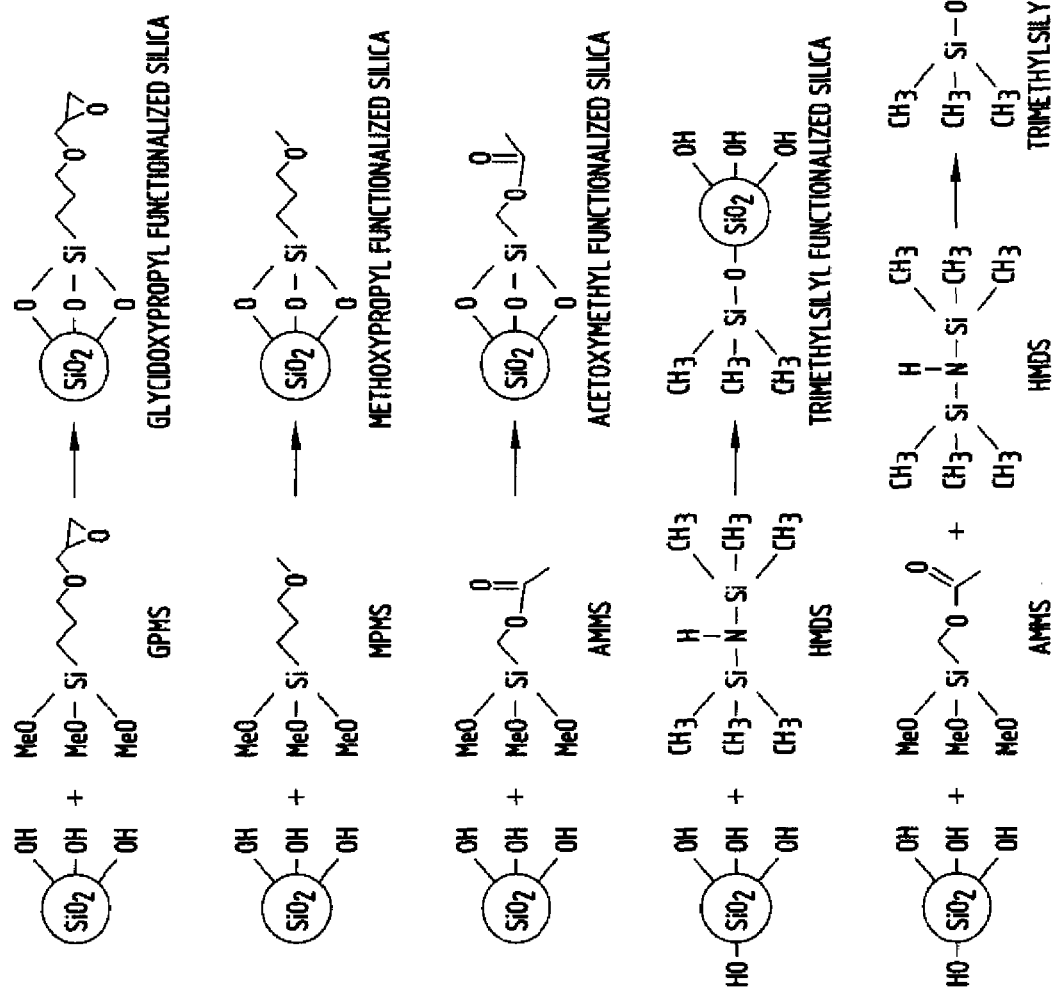
FIG. 4 is a drawing schematically illustrating examples of functionalization of silica nanoparticles.

The curable compositions of this invention comprise a thermosettable resin system including at least two chemical species that are reactive with each other, at least one of the chemical species having at least three functional groups that are reactive with functional groups of another species in the thermosettable resin system to facilitate cross-linking and formation of a cured polymer network; and at least one functionalized nanoscopic silica particulate material.

In certain preferred embodiments of the invention, the thermosettable resin system comprises a polyepoxide having three or more epoxy functional groups, and a cross-linking agent capable of reacting with the epoxide groups. Suitable polyepoxides that may be used in the curable compositions of the this invention include those having the general formula X—$((CH_2)_m$—(N)—$((CH_2)_n$-(Z)$)_2)_p$, wherein X is an aromatic ring or a cycloaliphatic ring, m is 0 or a positive integer, n is a positive integer, Z is an epoxy group (having empirical formula $C_2H_3O$), and p is a positive integer greater than or equal to 3. In the above formula, m is typically 0, 1 or 2, and n is typically 1, 2 or 3. Curable compositions in accordance with this invention may comprise one or more epoxy compounds having the structure identified above in combination with diepoxides (p=2) of the same general formula, and/or other di-, tri- or polyepoxides having a chemical structure different from that identified above.

Examples of suitable polyepoxides that may be employed in the invention include N,N,N'N'-tetraglycidyl-meta-xylenediamine and 1,3-bis(N,N-diglycidylaminomethyl)cyclohexanamine. These resins are commercially available from Mitsubishi Gas Chemical Company of Tokyo, Japan as Tetrad™-C and Tetrad™-X or Erisys™ GA-240 from CVC Specialty Chemicals of Morristown, N.J.

Illustrative examples of other epoxy resins that may be utilized in the thermosettable resin system include bisphenol A resins, bisphenol F resins, cycloaliphatic epoxy resins, novolac-based epoxy resins, cresol-based epoxy resins, triglycidyl or tetraglycidyl derivatives of an aminophenol or hydroxyphenol compound, as well as mixtures thereof.

Suitable cross-linking agents that are reactive with polyepoxide compounds to form cross-linked polymer networks include various polyamine compounds and imidazole compounds. Suitable polyamines and imidazoles are those that contribute to increased cross-linked density, increase rigidity, and increased molecular packing, but which do not possess undesirable degrees of steric hindrance and/or which do not contribute to undesirable reaction kinetics. Suitable polyamine cross-linkers typically have from 2 to 4 primary amine groups.

Suitable polyamines may also comprise one or more heteroatoms. Illustrative heteroatoms and groups comprising heteroatoms include halogen atoms, O, S, hydroxyl groups, secondary amine groups, ester groups, alkoxy groups, ether groups, thiol groups, carbonate groups, sulfonate groups, and combinations thereof.

In one embodiment, the cross-linking agent will comprise at least one polyamine having a structure including at least one aromatic ring and from 2 to 4 primary amine groups, typically two primary amine groups. In one exemplary embodiment, the at least one polyamine will have a structure including two or more aromatic rings. In one especially exemplary embodiment, the at least one polyamine will have a structure including three aromatic rings.

In yet another embodiment, the at least one polyamine will have the structure $(R)_p(NA_2)_q$, wherein R is at least one of an aromatic ring or a cycloaliphatic ring, p is a positive integer (typically having a value of from 1 to 4), and q is typically an integer from 2 to 4. The aromatic ring or cycloaliphatic ring (R) may be either substituted or unsubstituted, and may or may not comprise heteroatoms or groups comprising heteroatoms as discussed above. Suitable R groups may be at least one of a substituted or unsubstituted six-membered cycloaliphatic ring, a substituted or unsubstituted heteroaromatic ring, a substituted or unsubstituted six-membered aliphatic hetrocyclic ring, and combinations thereof. With regard to combinations of such structures, suitable R groups may comprise more than one of each type of structure, i.e., two or more aromatic rings in combination with one or more of the other identified structures.

If substituted, the aromatic ring or cycloaliphatic ring suitable for use in R may comprise one or more substituent groups such as alkyl groups, alkoxy groups, heteroatoms, groups comprising heteroatoms, and mixtures thereof Suitable alkyl groups and alkoxy groups would generally be those having less than five carbon atoms, especially those having from 1 to 3 carbon atoms.

In one exemplary embodiment, R will comprise unsubstituted aromatic rings, especially more than one unsubstituted aromatic ring. In one especially exemplary embodiment, R will comprise three unsubstituted aromatic rings.

Suitable cyclic polyamines may be represented by the formulas $((R_1$—W$)_k$—$R_2)_p$ —$(NH_2)_q$ and $((R_1$—W$R_2)_k)_p$—$(NH_2)_q$, wherein p and q are as defined above, $R_1$ and $R_2$ may be the same or different and are defined as R above, W is at least one of an alkyl group having from 1 to 3 carbon atoms, a heteroatom, a heteroatom containing radical, and combinations thereof, and k is an integer, typically from 1 to 4.

Specific examples of polyamines that may be utilized include 1,3-bis(3-aminophenoxy)benzene, 1,3-bis(4-aminophenoxy)benzene, 1,4-bis(4-aminophenoxy)benzene, 4,4'-diaminodiphenylsulfide, 2,4-diaminotolulene, 3,4-diaminotolulene, 2,3-diaminotolulene, 1,3-phenylenediamine, diaminobenzidine, 1,3-benzenediamine, 4,4'-diaminodiphenylmethane, 1-[(3-aminophenyl)amino]-3-phenoxy, 1-[[4-[(4-aminophenyl)methyl]phenyl]amino]-3-phenoxy, polymeric methylene dianiline, and combinations comprising two or more of the foregoing. In especially exemplary embodiment, the at least one polyamine will be at least one of 1,3-bis(3-aminophenoxy)benzene, 1,3-bis(4-aminophenoxy)benzene and 1,4-bis(4-aminophenoxy)benzene.

In an exemplary embodiment, the one or more polyamines will be used in a stoichometric or near stoichometric amount relative to the epoxy groups of the one or more polyepoxides.

In another embodiment, the curing agent will comprise a curing agent such as an imidazole.

Suitable imidazoles are those that have a high reaction temperature, i.e., over 100 degrees C., preferably over 150 degrees C. Illustrative examples include 2-phenylimidazole, 2-phenyl-4-methylimidazole (known as 2P4MZ), and the like.

The disclosed curable composition may also comprise a catalyst. An optional catalyst may be present in an amount from about 0 to 5.0% by weight based on the total weight of the thermosettable resin system, a typical amount being from about 0.1 to about 5% by weight based on the total weight of the thermosettable resin system, and more typically from about 0.2 to about 2.0% by weight based on the total weight of the thermosettable resin system.

Suitable optional catalysts are those that affect the desired behavior of the formulation. For instance, catalysts may be employed to promote cross-linking and/or to control the curing time of the resin. In one embodiment, the catalyst will be a Lewis acid. Suitable examples of catalysts include salts of trifluoromethane sulfonic acid, $BF_3$/amine complexes, imidazoles, phosphines, dicyanamides, and substituted dicyanamide compounds. In one embodiment, the catalysts will be at least one of a salt of trifluoromethane sulfonic acid or a $BF_3$/amine complex. In one exemplary embodiment, the catalyst will be a salt of trifluoromethane sulfonic acid.

Examples of suitable salts of trifluoromethane sulfonic acid include, but are not limited to, lithium triflate, amine triflate, and the lanthanide metal series of triflates. A commercially available example of a suitable salt of trifluoromethane sulfonic acid is FC520, a 60% solution of diethylamine triflate, commercially available from 3M of Saint Paul, Minn.

In one exemplary embodiment, the catalyst will comprise at least one of $(CF_3-SO_3)_n M^{n+}$, $(CF_3-SO_3)NR^3R^4$, $(BF_3)NR^3R^4$ or mixtures thereof, wherein n is an integer (typically 1 or 2), M is a metal, $R^3$ and $R^4$ may be the same or different and are at least one of H, an alkyl group and mixtures thereof. Suitable alkyl groups include those having from 1 to 20 carbon atoms, with 1 to 6 carbon atoms being particularly suitable. $R^3$ and $R^4$ may also be a fused or cycloaliphatic or aromatic ring that may contain a heteroatom. Examples of metals (M) include, but are not limited to, alkali metals, alkaline earth metals, transition metals, lanthanide metals, etc. In an exemplary embodiment, M will be at least one metal selected from Li, Ce, La, Nd, Eu, Yb, and combinations thereof.

The surface functionalized nanoscopic silica particles are comprised of nanoscopic silica particles reacted with a compound having organic moieties or functionalities that are compatible with an organic resin matrix, whereby the resulting surface functionalized nanoscopic silica particles are dispersible in organic solvents such as methyl ethyl ketone, and are dispersible in curable organic resin compositions, such as epoxy resin compositions.

Exemplary surface functionalizing agents include silane compounds and silazane compounds, with specific examples including 3-glycidoxypropyl trimethoxysilane (GPMS), 3-methoxypropyl trimethoxysilane (MPMS), acetoxymethyl trimethoxysilane (AMMS), hexamethyldisilazane (HMDS), and combinations thereof. Any combination of functionalized agents may also be used. GPMS can be reacted with the hydroxyl functional groups at the surface of a silicon particle (silanol groups) to form glycidoxypropyl functionalized silica. MPMS can be reacted in a similar way to form methoxypropyl functionalized silica, AMMS can be reacted with silica in a similar fashion to form acetoxymethyl functionalized silica, and HMDS can be reacted in a similar fashion to form trimethylsilyl functionalized silica. A combination of AMMS and HMDS can be reacted with silica particles to form trimethylsilyl-acetoxymethyl functionalized silica. Similar and analogous surface functionalizing agents may be employed to modify the surface of nanoscopic silica particles to provide excellent compatibility, dispersability and/or reactivity with an organic curable resin system, such as an epoxy resin system.

The expression "nanoscopic" as used herein to describe the nanoscopic silica particles refers to particles that have dimensions (e.g., diameter) that are at least about one nanometer and less than one micrometer (i.e., less than 1,000 nanometers). Typically, the curable compositions of this invention may contain low amounts of silica particles having a dimension greater than one micrometer, the upper limit being an amount that does not compromise electrical connectivity at the solder joints due to silica particle inclusion. By eliminating or substantially eliminating the larger silica particles (e.g., those having a dimension greater than one micrometer), solder connection reliability problems commonly associated with the use of resin compositions containing these large particles for no-flow undertilling of electronic component assemblies is eliminated or substantially reduced. Typically, the compositions of this invention will contain functionalized silica particles having a particle size distribution in the range from about 1 nanometer to about 200 nanometers. The surface functionalization treatment does not add appreciably to the dimensions or diameter of the nanoscopic silica particles, such that the particles have substantially the same size both before and after the surface functionalization treatment.

Suitable starting materials for preparing the functionalized nanocopic silica particles include various commercially available aqueous colloidal silica products, such as Nalco 1034A, 34% wt. $SiO_2$ and Snowtex-O, 20% wt. $SiO_2$, available from Nalco Company and Nissan Chemical, respectively. GPMS organosilane functionalizing agent is available from Dow Corning. MPMS, AMMS, ECEMS and HMDS are available from Gelest, Inc. The amount of functionalized nanoscopic silica material employed in the curable compositions of this invention typically ranges from about 10% to 40% by weight based on the total weight of the curable composition. However, there is neither a lower limit nor an upper limit. Higher filler loading levels increase the viscosity of the composition and make processing more difficult, while lower levels reduce the beneficial effect (e.g., lowering of CTE, etc.).

In general, the functionalization of colloidal silica can be achieved by adding a functionalization agent to a commercially available aqueous dispersion of colloidal silica in a suitable molar ratio (for example, from 5 to 20 moles per hundred moles of $SiO_2$), to which a suitable co-solvent, such as 2-propanol, may be added. As previously stated, two or more different organosilane functionalization agents may be added, either together, or at different times during the functionalization treatment. The reaction mixture may be refluxed (for example, from a few hours to about two days, preferably until the reaction is complete or nearly complete) and thereafter optionally treated with poly(4-vinylpyridine) (PVP, 2% cross-link) in order to neutralize the acidic character of the solution. This step may be followed by a solvent substitution process, in which water is distilled off while being replaced with another solvent, such as 2-propanol.

The cured resin compositions of this invention exhibit a low coefficient of thermal expansion (CTE), typically less than 60 ppm/° C., and more preferably less than about 40 ppm/° C. In addition, the cured resin compositions of this invention have a relatively high glass transition temperature ($T_g$), typically greater than 120° C., and more preferably from about 150° C. to about 180° C. In addition to the excellent CTE and $T_g$, the cured resins of this invention are relatively rigid, typically having a modulus at 25° C. of from about 4 to about 6 GPa (giga pascal), and a modulus at 150° C. from about 1 to about 3 GPa.

The compositions of this invention may be used advantageously for encapsulating, overmolding, and/or underfilling an electrical circuit device. More particularly, the compositions of this invention are particularly useful for underfilling electronic circuit assemblies, especially employing a no-flow underfill technique.

The electronic circuit assemblies of this invention comprise a substrate having a pattern of electrical conductors, an electronic component mechanically and electrically connected to the electrical circuit of the substrate (typically by a solder joint), the electronic component having a surface adjacent the substrate in spaced proximity to the substrate to define an interstitial space between the electronic component and the substrate, and a thermoset resin composition disposed in the interstitial space between the electronic component in the substrate, the thermoset resin composition comprising surface functionalized nanoscopic silicon particles dispersed in a thermoset resin. The substrate is typically a circuit board on which an electrically conductive pattern is disposed (e.g., a printed circuit board), and the electronic component is typically a semiconductor device, such as a flip chip or other package such as ball grid arrays (BGA), chip-scale package, etc., but may be another type of electronic component, such as a resistor, or other surface mount device.

The compositions of the invention are especially useful for underfilling flip-chip devices. A flip chip is a surface mounted chip (integrated circuit device) having, as sole connection means to a substrate, a plurality of solder bumps. The substrate on which the flip chip is mounted includes a pattern of bond pads that can be aligned in registry with the pattern of solder bumps on the flip chip. Alternatively, a flip chip may be mounted on a package substrate having the required pattern of bond pads for connecting the flip chip to the package substrate.

FIG. 1 shows a cross-section of one embodiment of an electronic circuit assembly 100. The assembly includes a flip chip 110 having a plurality of solder bumps 115 on a surface 112. Flip chip 110 is mated to a substrate 120 having bond pads 130. An optional layer of solder resist (not shown) may cover package substrate 120, and a layer of underfill material 135 fills an interstitial space 145 between substrate 120 and flip chip 110.

Optionally, prior to contact with the underfill material 135, surface 112 may be covered with an initial passivation layer (not shown) and then a protective compliant layer (not shown), e.g., a thin (about 3 micrometers) layer of polyimide.

Flip-chip bumps 115 may be of any suitable conductive material, e.g., eutectic SnPb solders, high Pb solders, lead free solders, Sn and Sn alloy solders, and metals such as Cu, Au, Ag, Ni, Sn, or suitable alloys thereof.

Underfill material 135 is a thermoset resin composition as described above, which comprises surface functionalized nanoscopic silica particles dispersed in a thermoset resin, and may be cured as described above.

Substrate 120 may include a ceramic, organic or metal core. Substrate 120 generally includes bond pads 130 in locations suitable for electrically mating to corresponding flip-chip bumps 115.

It will be appreciated that in FIGS. 1-3, the illustrated cross-sections represent one embodiment, wherein the electronic component is a flip chip 110 having a plurality of bumps 115, and which may be one of many electronic components on a substrate.

Electronic circuit assembly 100 can be made by applying the curable composition 135 to a substrate 120, positioning electronic component 110 so that solder bumps 115 are in registry with a pattern of bond pads 130 on substrate 120, with surface 112 contacting curable composition 135, such that composition 135 fills or substantially fills an interstitial space 145 defined between surface 112 and substrate 120. Thereafter, curable composition 135 is cured to provide a completed assembly 100.

It will be appreciated that the disclosed method of making a flip-chip assembly encompasses both conventional flip-chip processes employing capillary-flow underfill, as well as no-flow underfill processes. Various processes may be used to apply underfill material 135 to substrate 120. Examples of such processes includes dispensing or printing.

The thickness of the applied underfill 135 is not limited, and can be varied for specific applications as needed.

As illustrated in FIG. 2, electronic component 110 is joined to substrate 120 by pressing solder bumps 115 through underfill material 135 in the direction of the arrows until bumps 115 contact bond pads 130.

In another embodiment, a capillary-flow underfill process may be utilized as illustrated in FIG. 3. In this process, an underfill material 135 is introduced into an interstitial space between substrate 120 and electronic component 110. During this process, underfill material 135 flows in the direction indicated by the arrows in the space 145 between electronic component 110 and substrate 120. It will be appreciated this process produces an electronic circuit assembly as shown in FIG. 1.

EXAMPLES

Materials Used for Surface Modification of Colloidal Silica

Aqueous colloidal silica (Nalco 1034A, 34% wt. $SiO_2$) and (Snowtex-O, 20% wt. $SiO_2$) were provided by Nalco Co. and Nissan Chemical, respectively.

Organosilane functionalization agents 3-glycidoxypropyl trimethoxysilane (GPMS) was provided by Dow Corning and 3-methoxypropyl trimethoxysilane (MPMS), acetoxymethyl trimethoxysilane (AMMS), 2-(3,4-epoxycyclohexyl)-ethylt-rimethoxysilane (ECEMS) and hexamethyldisilazane (HMDS) were purchased from Gelest, Inc. 2-propanol, Poly (4-vinylpyridine) (PVP, 2% crosslink) and methyl ethyl ketone (MEK) were purchased from Aldrich.

General Procedure for the Functionalization of Colloidal Silica

The functionalization of colloidal silica (FIG. 4) is performed by adding the organosilane functionalization agent to the commercially available aqueous dispersion of colloidal silica in the appropriate molar ratio (from 5 to 20 moles per 100 moles of $SiO_2$) to which 2-propanol has been added as a co-solvent. In some instances, the colloidal silica may be functionalized with two different organosilanes, adding together or at different times during the reaction.

The reaction mixtures are refluxed for up to two days then optionally treated with PVP in order to neutralize the acidic character of the solution. This step is followed by a solvent substitution process, in which water is distilled off while being replaced by 2-propanol. The 2-propanol is then replaced by MEK through the same process.

Typical Examples

Preparation of Trimethylsilyl/Methoxypropyl Functionalized Silica:

Snowtex-O colloidal silica (100 g, 20 g $SiO_2$ 0.32 mole), 100 mL of 2-propanol and 3-methoxypropyl triethoxysilane (6.21 g. 0.032 mole) are mixed in 500 mL three neck round bottom flask equipped with a condenser. The solution is refluxed for up to 48 hours. Hexamethyldisilazane (2.59 g, 0.016 mole) is added and the solution refluxed for up to another 24 hours. After cooling, the silica solution is optionally treated with 1.5 g of PVP overnight and then filtered twice through glass wool. The solution is then placed in a distillation apparatus equipped with an addition funnel. The water/2-propanol azeotrope mixture is distilled while adding 2-propanol dropwise until water is completely removed. 2-propanol is replaced by MEK using the same process.

Trimethylsilylation of Colloidal Silica:

Snowtex-O colloidal silica (100 g, 20 g $SiO_2$ 0.32 mole), 100 mL of 2-propanol and hexamethyldisilazane (HMDS) (5.16 g, 0.032 mole) are mixed in 500 mL three neck round bottom flask equipped with a condenser. After 48 hours refluxing, the solution is cooled to room temperature, treated with 1.5 g of PVP overnight and filtrated twice through glass wool. The solution is then placed in a distillation apparatus equipped with an addition funnel. The water/2-propanol azeotrope mixture is distilled while adding 2-propanol dropwise until water is completely removed. 2-propanol is replaced by MEK using the same process.

Preparation of Functionalized Silica Powder:

The functionalized colloidal silica solution is placed in a rotary evaporator and the solvent (MEK) evaporated at 60° C. under reduced pressure. The obtained solid was redispersed in a minimum amount of acetone and precipitated in hexane. The precipitated silica is filtered using a 0.2 μm filter. This process is repeated a second time to yield a fine white powder. The silica is then dried under vacuum at 50° C. for 24 hours. It was surprisingly discovered that precipitated HMDS-functionalized silica could be easily re-dispersed in a solvent such as acetone, whereas silica solely functionalized with GPMS, MPMS, AMMS or a combination of these without HMDS could not be easily re-dispersed after precipitation.

Preparation of Resin Composition:

In a typical formulation, the functionalized nanosilica solution is mixed with the TGMX epoxy resin followed by solvent (MEK) evaporation under reduced pressure at 60° C. The resulting composition is mixed thoroughly with a stoichometric or near stoichometric amount of the amine curing agent (examples of the amines are shown in Table 1). The formulation is then degassed under vacuum at 60° C. before casting.

Formulations were also prepared using solid imidazole derivatives as curing agents (i.e. Curazole 2PZ). The preferred imidazoles are those with a maximum cure temperature of 140-200° C. (as measured by DSC). The amount of imidazole derivatives used in the compositions varies from 2 to 8 wt % of the epoxy and preferably from 3 to 6 wt % and most preferably from 4 to 5 wt %. The curing agent is dispersed into the solvent-free epoxy-nanosilica mixture using a high speed mechanical stirrer. The composition is then degassed for 20 minutes in a vacuum oven heated at 70° C. at which temperature the curing agent dissolves into the epoxy resin.

The curing of the epoxy-nanosilica compositions was performed at a temperature of 150° C. The cure temperature of the epoxy nanocomposition may be from room temperature up to 250° C. and preferably between 100-200° C. and most preferably between 120-170° C. The curing may also be carried out by heating the sample from room temperature to 250° C. or lower for a short period of time (to allow for solder reflow) followed by post curing at lower temperatures (e.g. 160° C.) for longer periods of time.

TABLE I

Abbreviated names and chemical composition of resin and curing agents.

| Product Name | Chemical Composition |
|---|---|
| TGMX | Tetraglycidyl meta-xylylenediamine |
| TGDDM | Tetraglycidyl-4,4'-diaminodiphenylmethane |
| APB | 1,3-Bis(3-aminophenoxy)benzene |
| Ancamine Z[1] | A mixture of: 1,3-benzenediamine 4,4'-diaminodiphenyl methane 1-[(3-aminophenyl)amino]-3-phenoxy and 1-[[4-[(4-aminophenyl)methyl]phenyl]amino]-3-phenoxy- |
| Ancamine Y[1] | A mixture of: 4,4'-diaminodiphenyl methane Polymeric methylene dianiline 3,4-diaminotoluene, 2,3-diaminotoluene and 2,4-diaminotoluene |
| Curezol 2PZ[1] | 2-phenyl imidazole |

[1]Products of Air Products and Chemicals

TABLE II

Examples of Low CTE Epoxy Nanocompositions

| Formula | Resin | Curing Agent | Nanosilica Functionalization | Wt. % | CTE (α1) pm/° C. | $T_g$ ° C. | Modulus @25° C. (GPa) | Modulus @150° C. (GPa) |
|---|---|---|---|---|---|---|---|---|
| 1 | TGMX | Ancamine Y | None | | 52 | 170 | | |
| 2 | TGMX | Ancamine Y | Acetoxy | 24 | 38 | 176 | 4.6 | 2.7 |
| 3 | TGMX | Ancamine Y | Nanopl XP21-1184* | 30 | 35 | 160 | 5.0 | 3.4 |
| 4 | TGMX | Ancamine Y | Acetoxy/Trimethylsilyl | 23 | 40 | 165 | 5.3 | 3.1 |
| 5 | TGMX | Ancamine Y | Precipitated/Redispersed Acetoxy/Trimethylsilyl | 23 | 40 | 165 | 4.8 | 3.0 |
| 6 | TGMX | Ancamine Y | Methoxy propyl/Trimethylsilyl | 24 | 42 | 180 | 4.9 | 3.0 |
| 7 | TGMX | Ancamine Y | Trimethylsilyl | 22 | 41 | 170 | | |
| 8 | TGMX | Aradur 5200 | None | | 53 | 164 | | |
| 9 | TGMX | Aradur 5200 | Precipitated/Redispersed Acetoxy/Trimethylsilyl | 38 | 38 | 163 | | |
| 10 | TGMX | Aradur 5200 | Precipitated/Redispersed Trimethylsilyl | 31 | 42 | 173 | 5.2 | 3.1 |
| 11 | TGMX | Ancamine Z | None | | 43 | 164 | | |
| 12 | TGMX | Ancamine Z | Acetoxy | 24 | 35 | | 5.3 | 3.0 |
| 13 | TGMX | Ancamine Z | Methoxy propyl/Trimethylsilyl | 32 | 37 | 164 | | |
| 14 | TGMX | Aradur 5200 | Trimethylsilyl | | 41 | | | |
| 15 | TGMX | Curezol 2PZ (at 6% by Wt.) | None | | 54 | 140 | | |
| 16 | TGMX | Curezol 2PZ (at 6% by Wt.) | Glycidyloxy propyl | 21 | 40 | 122 | | |
| 17 | TGMX | Curezol 2PZ (at 5% by Wt.) | Acetoxy/Trimethylsilyl | 33 | 39 | 120 | | |
| 18 | TGMX/TGDDM (77:23) (wt:wt) | Curezol 2PZ (at 4% by Wt.) | Acetoxy | 30 | 37 | 136 | | |
| 19 | TGMX | APB | None | | 43 | 150 | | |
| 20 | TGMX | APB | Acetoxy/Trimethylsilyl | 28 | 31 | 136 | 5.6 | |
| 21 | TGMX | APB | 3-methoxypropyl/Trimethylsilyl | 27 | 36 | 152 | 4.6 | 1.3 |

*Commercially available functionalized Nanosilica suspension in Butylacetate provided by Hans-Chemie It will be understood by those who practice the invention and those skilled in the art that various modifications and improvements may be made to the invention without departing from the spirit of the disclosed concept. The scope of protection afforded is to be determined by the claims and by the breadth of interpretation allowed by law.

The invention claimed is:

1. A method of making an electronic circuit assembly comprising:
    providing a substrate having a pattern of electrical conductors;
    depositing a curable resin composition on a surface of the substrate, the curable resin composition comprising about 10% to about 40% by weight, based on the total weight of the curable resin composition, of surface functionalized nanoscopic silica particles having a particle size distribution of about 1 nanometer to about 200 nanometers dispersed in a thermosettable resin comprising a polyepoxide having the formula $X-((CH_2)_m-(N)-((CH_2)_n-(Z))_2)_p$, wherein X is an aromatic ring or a cycloaliphatic ring, m is 0 or a positive integer, n is a positive integer, Z is an epoxy group, and p is 2, and further comprising a polyamine cross-linking agent having at least one of from 2 to 4 primary amine groups, an imidazole cross-linking agent, or a combination thereof and wherein the surface functionalized nanoscopic silica particles are functionalized with a silane compound, a silazane compound, or a combination thereof;
    positioning an electronic component having solder bumps on the substrate, so that the solder bumps are in registry with a corresponding pattern of bond pads on the substrate and so that the curable resin composition is disposed between and substantially fills an interstitial space between the substrate and the electronic component;
    reflowing the solder bumps to make electrical connections between the electronic component and the pattern of electrical conductors on the substrate; and
    curing the curable resin composition to produce a cured resin composition concurrently or subsequently to reflowing the solder bumps, wherein the cured resin composition has a modulus of about 1 to about 3 gigapascals at 150° C.

2. The method of claim 1, wherein curing the curable resin composition is at a cure temperature of room temperature to 250° C.

3. The method of claim 1, wherein the cured resin composition has a coefficient of thermal expansion less than 60 ppm/° C.

4. The method of claim 3, wherein the coefficient of thermal expansion is less than 40 ppm/° C.

5. The method of claim 1, wherein the cured resin composition has a glass transition temperature greater than 120° C.

6. The method of claim 5, wherein the glass transition temperature is from about 150° C. to about 180° C.

7. The method of claim 1, wherein the cured resin composition has a modulus of about 4 to about 6 gigapascals at 25° C.

8. The method of claim 1, wherein the surface functionalized nanoscopic silica particles are functionalized with a compound selected from the group consisting of 3-glycidoxypropyl trimethoxysilane, 3-methoxypropyl trimethoxysilane, acetoxymethyl trimethoxysilane, hexamethyldisilazane (HMDS), and a combination thereof.

9. The method of claim 1, wherein the polyepoxide comprises N,N,N',N'-tetraglycidyl-meta-xylylenediamine.

10. The method of claim 1, further comprising a polyepoxide selected from the group consisting of a polyepoxide having the formula $X-((CH_2)_m-(N)-((CH_2)_n-(Z))_2)_p$, wherein X is an aromatic ring or a cycloaliphatic ring, m is 0 or a positive integer, n is a positive integer, Z is an epoxy group, and p is a positive integer greater than or equal to 3, a bisphenol A epoxy resin, a bisphenol F epoxy resin, a cycloaliphatic epoxy resin, a novolac-based epoxy resin, a cresol-based epoxy resin, a triglycidyl derivative of an aminophenol, a triglycidyl derivative of a hydroxyphenol, a tetraglycidyl derivative of an aminophenol, a tetraglycidyl derivative of a hydroxyphenol, and a combination thereof.

11. The method of claim 1, wherein the curable resin composition comprises the polyamine cross-linking agent having from 2 to 4 primary amine groups.

12. The method of claim 11, wherein the polyamine cross-linking agent having from 2 to 4 primary amine groups is used in a stoichiometric or near stoichiometric amount relative to the epoxy groups of the polyepoxide.

13. The method of claim 1, wherein the curable resin composition comprises the imidazole cross-linking agent.

14. The method of claim 1, wherein the imidazole cross-linking agent is present in an amount of 2 to 8 weight percent of the epoxy.

15. The method of claim 1, wherein the electronic component is a flip chip mechanically and electrically connected to the substrate by solder bumps.

16. A method of making an electronic circuit assembly comprising:
    providing a substrate having a pattern of electrical conductors;
    mechanically and electrically connecting an electronic component to the substrate so that the electronic component has a surface adjacent the substrate in spaced proximity to the substrate to define an interstitial space between the electronic component and the substrate;
    introducing a curable resin composition into the interstitial space between the electronic component and the substrate, the curable resin composition comprising about 10% to about 40% by weight, based on the total weight of the curable resin composition, of surface functionalized nanoscopic silica particles having a particle size distribution of about 1 nanometer to about 200 nanometers dispersed in a thermosettable resin comprising a polyepoxide having the formula $X-((CH_2)_m-(N)-((CH_2)_n-(Z))_2)_p$, wherein X is an aromatic ring or a cycloaliphatic ring, m is 0 or a positive integer, n is a positive integer, Z is an epoxy group, and p is 2, and further comprising a polyamine cross-linking agent having at least one of from 2 to 4 primary amine groups, an imidazole cross-linking agent, or a combination thereof; and wherein the surface functionalized nanoscopic silica particles are functionalized with a silane compound, a silazane compound, or a combination thereof; and
    curing the curable resin composition to produce a cured resin composition, wherein the cured resin composition has a modulus of about 1 to about 3 gigapascals at 150° C.

17. The method of claim 16, wherein curing the curable resin composition is at a cure temperature of room temperature to 250° C.

18. The method of claim 17, wherein the cured resin composition has a coefficient of thermal expansion less than 60 ppm/° C.

19. The method of claim 18, wherein the coefficient of thermal expansion is less than 40 ppm/° C.

20. The method of claim 17, wherein the cured resin composition has a glass transition temperature greater than 120° C.

21. The method of claim 20, wherein the glass transition temperature is from about 150° C. to about 180° C.

22. The method of claim 17, wherein the cured resin composition has a modulus of about 4 to about 6 gigapascals at 25° C.

23. The method of claim 17, wherein the polyepoxide comprises N,N,N',N'-tetraglycidyl-meta-xylylenediamine.

24. The method of claim 17, further comprising a polyepoxide selected from the group consisting of a polyepoxide having the formula $X-((CH_2)_m-(N)-((CH_2)_n-(Z))_2)_p$, wherein X is an aromatic ring or a cycloaliphatic ring, m is 0 or a positive integer, n is a positive integer, Z is an epoxy group, and p is a positive integer greater than or equal to 3, a bisphenol A epoxy resin, a bisphenol F epoxy resin, a cycloaliphatic epoxy resin, a novolac-based epoxy resin, a cresol-based epoxy resin, a triglycidyl derivative of an aminophenol, a triglycidyl derivative of a hydroxyphenol, a tetraglycidyl derivative of an aminophenol, a tetraglycidyl derivative of a hydroxyphenol, and a combination thereof.

25. The method of claim 17, wherein the curable resin composition comprises the polyamine cross-linking agent having from 2 to 4 primary amine groups.

26. The method of claim 25, wherein the polyamine cross-linking agent having from 2 to 4 primary amine groups is used in a stoichiometric or near stoichiometric amount relative to the epoxy groups of the polyepoxide.

27. The method of claim 17, wherein the curable resin composition comprises the imidazole cross-linking agent.

28. The method of claim 27, wherein the imidazole cross-linking agent is present in an amount of 2 to 8 weight percent of the epoxy.

29. The method of claim 17, wherein the electronic component is a flip chip mechanically and electrically connected to the substrate by solder bumps.

30. The method of claim 16, wherein the surface functionalized nanoscopic silica particles are functionalized with a compound selected from the group consisting of 3-glycidoxypropyl trimethoxysilane, 3-methoxypropyl trimethoxysilane, acetoxymethyl trimethoxysilane, hexamethyldisilazane (HMDS), and a combination thereof.

* * * * *